252-95 CROSS REFERENCE EXAMINER

United States Patent Office 2,982,625

Patented May 2, 1961

2,982,625

ETCHANT AND METHOD

Edward B. Saubestre, Elmhurst, N.Y., assignor, by mesne assignments, to Sylvania Electric Products Inc., Wilmington, Del., a corporation of Delaware No Drawing. Filed Mar. 22, 1957, Ser. No. 647,750

10 Claims. (Cl. 41—42)

The present invention relates generally to the manufacture of printed circuits and wires, and in particular deals with improved methods and baths for chemically removing metal and metal alloys during the manufacture of said printed circuits and wires.

In general, printed circuits and wire are manufactured by applying to a metal-clad laminate a stop-off of resist material in a positive pattern corresponding to the ultimate wiring or circuit desired and thereafter subjecting the exposed regions of the copper-clad laminate to attack by chemical etching to remove the metal from the exposed and unprotected regions. After this is achieved, the resist material is removed from the protected regions, leaving the laminate with the metal pattern in the configuration of the stop-off of resist material. For printed circuits and wires of copper and copper alloys, and using conventional resist materials, the most commonly employed etchants are nitric acid and ferric chloride. As a variation of this general method, printed circuits and wires can be prepared by applying a negative resist pattern to the copper-clad laminate, followed by the application of a lead-tin or solder alloy to the unmasked regions. The solder alloy provides a positive resist pattern complementary to the negative resist pattern and masks the regions to be utimately protected and retained. When the positive lead-tin resist is applied, the preliminary negative resist is removed and the prepared laminate is subjected to chemical etching. When a lead-tin resist is used, the usual and most popular etchants cannot be employed since such etchants will also attack the lead-tin resist. Accordingly, a number of additional etchants have been made available to be used with a solder-type of resist, the most popular of these being of the chromic-sulfuric acid type.

It is broadly an object of the present invention to provide an improved method of preparing printed circuits and wires. Specifically, it is within the contemplation of the present invention to provide an improved etchant for chemically removing copper and copper alloys in the presence of protective resists of solder materials.

Practical experience with etchants of the chromic-sulfuric acid type has indicated a number of practical disadvantages and shortcomings. Among the most troublesome disadvantages of the chromic-sulfuric type of etchant are that they operate at relatively high temperatures, of the order of 80° C; that they require the exposure of the copper surfaces under attack for a comparatively long period of etching, of the order of 15 minutes or more; and that they have a rather short useful life which is brought about by the rapid-build-up of copper therein. The short life of the etchant makes it necessary to replace or replenish the bath at comparatively frequent intervals to avoid the necessity of etching the part for prohibitively long periods. Wherever possible, the nitric acid and ferric chloride etchants are preferred to the chromic-sulfuric acid type, and the latter is only used when the resist material is of a lead-tin alloy which is subject to chemical attack by the preferred nitric acid and ferric chloride etchants.

It is a further object of the present invention to provide an improved chromic-sulfuric acid type of etchant obviating one or more of the aforesaid difficulties. Specifically, it is an objective of the present invention to employ an addition agent in conjunction with the chromic-sulfuric type of etchant to increase the useful life of the bath and to allow the bath to be used over a prolonged period without a corresponding increase in the etching time for parts under treatment.

I have found that an improved etchant consisting essentially of a mixture of chromic and sulfuric acids and containing peroxysulfate ions is exceptionally suitable for the chemical etching of copper and copper alloys in the presence of lead-tin resists. The addition of the peroxysulfate ion, which is a strong oxidizing agent, increases the useful life of the chromic-sulfuric type of etchant. In addition, I have found that the action of the peroxysulfate ion may be greatly enhanced by the further addition of silver ions. A bath containing peroxysulfate ions and silver ions, as addition agents, will have markedly improved ageing characteristics with a significant decrease in the required etching time.

Improved etchants found particularly desirable in accordance with the present invention are those containing a mixture of chromic and sulfuric acids containing peroxysulfate ions selected from the group consisting of peroxysulfate salts and peroxysulfuric acid and silver ions. The peroxysulfate ion is present in an amount between 14 and 285 grams per liter, while the silver ion is present in an amount between .03 and .3 gram per liter.

In accordance with method aspects of the present invention, printed circuits may be manufactured on a copper-clad laminate having a resist of solder material protecting prescribed regions of the copper against chemical attack by subjecting the prepared laminate to attack by a chromic-sulfuric type of etchant containing peroxysulfate ions and silver ions for a period adjusted to remove the copper from the regions unprotected by the resist.

The use of the peroxysulfate ion, which is a strong oxidizing agent, supplements the action of the chromic-sulfuric acid baths; and because of the high degree of acidity of the chromic-sulfuric acid bath, the active agent is peroxysulfuric acid which forms in the bath. The fact that the peroxysulfate ion is a strong oxidizing agent may be verified by ascertaining the standard potential from the following equation:

$$S_2O_8^{=} + 2e \rightarrow 2SO_4^{=}$$
$$E^0 = +2.05 \text{ v.}$$

The large standard potential, of the order of +2.05 volts, is verification of the oxidizing power of the peroxysulfate ion in the present improved solutions. This oxidizing power may be traced to the structure of the peroxysulfate ion, which contains a peroxide linkage (—O—O—) as follows:

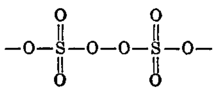

It is my present understanding that the speed of the above reaction is accelerated by the presence of silver ions; and that an intermediate form of silver ion ($Ag^{+++}$) exists which is formed in accordance with the following equation:

$$S_2O_8^{=} + Ag^{+} \rightarrow 2SO_4^{=} + Ag^{+++}$$

This unstable silver ion readily oxidizes copper as follows:

$$Ag^{+++} + Cu \rightarrow Ag^{+} + Cu^{++}$$

The silver ion may be added as any soluble silver salt, suitable sources of the silver ion are silver nitrate, silver fluoride, and silver perchlorate. Using silver nitrate as the soluble silver salt, the addition of between .05 and .5 gram per liter accelerates the action of the peroxysulfate ions. An excessive amount of silver in the bath is deleterious in that silver plating of the copper by galvanic action may occur, and, accordingly, the upper limit of .5 gram per liter should not be exceeded. When less than .05 gram per liter of silver nitrate is added to the bath, the reaction is not sufficiently accelerated to significantly affect its speed.

The optimum amount of peroxysulfate ion to be added is dependent upon the amount of sulfuric acid present in the chromic-sulfuric bath. The larger the amount of sulfuric acid present, the smaller the optimum value of the amount of peroxysulfate salt or acid is required for operation in accordance with the present invention. Concerning the range of peroxysulfate ion concentration, there is no true minimum value since even small amounts of peroxysulfate improve life characteristics to some extent. Further, there is no well defined upper limit for the peroxysulfate ion concentration, but it has been observed that at very high concentrations of peroxysulfate ion, etching time increases somewhat. To advantage, the peroxysulfate content should be maintained near the optimum value in order to derive maximum benefit from its use; but wide deviations from the optimum value are not critical and are within the contemplation of the present invention.

A number of illustrative examples will now be set forth to demonstrate the inter-relationship between the sulfuric acid content of the chromic-sulfuric etchant and the peroxysulfate salts anrd peroxysulfuric acid. In all of the examples, between 450 and 480 grams per liter of chromic acid is used in accordance with conventional practice for etchants of this general type. However, it is within the contemplation of the invention to employ other concentrations of chromic acid. Further, in the following illustrative examples, the soluble silver salt is silver nitrate. However, it is within the contemplation of the invention to use other soluble silver salts, such as silver fluoride and silver perchlorate.

The following illustrative formulations are based upon the use of potassium peroxysulfate salts:

Example I:

| | | |
|---|---|---|
| $CrO_3$ | g./l. | 450–480 |
| $H_2SO_4$ (S.g.l. 84) | ml./l. | —125 |
| $K_2S_2O_8$ | g./l. | —20 |
| $AgNO_3$ | g./l. | —0.05–0.5 |

Example II:

| | | |
|---|---|---|
| $CrO_3$ | g./l. | 450–480 |
| $H_2SO_4$ (S.g.l. 84) | ml./l. | 30 |
| $K_2S_2O_8$ | g./l. | 200 |
| $AgNO_3$ | g./l. | —0.05–0.5 |

Example III:

| | | |
|---|---|---|
| $CrO_3$ | g./l. | 450–480 |
| $K_2S_2O_8$ | g./l. | 400 |
| $AgNO_3$ | g./l. | —0.05–0.5 |

The following illustrative formulations are based upon the use of sodium peroxysulfate salts:

Example IV:

| | | |
|---|---|---|
| $CrO_3$ | g./l. | 450–480 |
| $H_2SO_4$ (S.g.l. 84) | ml./l. | —125 |
| $Na_2S_2O_8$ | g./l. | —18 |
| $AgNO_3$ | g./l. | —0.05–0.5 |

Example V:

| | | |
|---|---|---|
| $CrO_3$ | g./l. | 450–480 |
| $H_2SO_4$ (S.g.l. 84) | ml./l. | 30 |
| $Na_2S_2O_8$ | g./l. | 176 |
| $AgNO_3$ | g./l. | 0.05–0.5 |

Example VI:

| | | |
|---|---|---|
| $CrO_3$ | g./l. | 450–480 |
| $Na_2S_2O_8$ | g./l. | 350 |
| $AgNO_3$ | g./l. | 0.05–0.5 |

The following illustrative formulations are based upon the use of ammonium peroxysulfate salts:

Example VII:

| | | |
|---|---|---|
| $CrO_3$ | g./l. | 450–480 |
| $H_2SO_4$ (S.g.l. 84) | ml./l. | —125 |
| $(NH_4)_2S_2O_8$ | g./l. | —17 |
| $AgNO_3$ | g./l. | —0.05–0.5 |

Example VIII:

| | | |
|---|---|---|
| $CrO_3$ | g./l. | 450–480 |
| $H_2SO_4$ (S.g.l. 84) | ml./l. | 30 |
| $(NH_4)_2S_2O_8$ | g./l. | 169 |
| $AgNO_3$ | g./l. | 0.05–0.5 |

Example IX:

| | | |
|---|---|---|
| $CrO_3$ | g./l. | 450–480 |
| $(NH_4)_2S_2O_8$ | g./l. | 340 |
| $AgNO_3$ | g./l. | 0.05–0.5 |

The following illustrative formulations are based upon the use of peroxysulfuric acid:

Example X:

| | | |
|---|---|---|
| $CrO_3$ | g./l. | 450–480 |
| $H_2SO_4$ (S.g.l. 84) | ml./l. | —125 |
| $H_2S_2O_8$ | g./l. | —14 |
| $AgNO_3$ | g./l. | —0.05–0.5 |

Example XI:

| | | |
|---|---|---|
| $CrO_3$ | g./l. | 450–480 |
| $H_2SO_4$ (S.g.l. 84) | ml./l. | 30 |
| $H_2S_2O_8$ | g./l. | 144 |
| $AgNO_3$ | g./l. | 0.05–0.5 |

Example XII:

| | | |
|---|---|---|
| $CrO_3$ | g./l. | 450–480 |
| $H_2S_2O_8$ | g./l. | 290 |
| $AgNO_3$ | g./l. | 0.05–0.5 |

A typical process in accordance with the present invention will now be described in detail to facilitate a more thorough understanding of the concepts involved herein:

A suitable copper-clad laminate which includes an insulating base and a coating or layer of copper is formed with a negative resist of any conventional resist material, such as Unichrome 324. This negative resist outlines the pattern of the desired printed circuit or wire to be formed on the copper-clad laminate. Thereupon the copper laminate with the negative resist thereon is plated in the exposed copper regions with a lead-tin alloy, containing between 20 and 60 percent of lead and between 40 and 80 percent of tin. Thereupon the first resist is removed, by immersing the same in a suitable organic solvent. When the first resist is removed, the positive solder resist pattern protects the copper regions which ultimately form the printed circuit or wire against chemical attack. Thereupon, the prepared laminate is exposed to the present improved chromic-sulfuric acid type of etchant including the peroxysulfate ion, and preferably the silver ions, at room temperature for a period adjusted to effect the removal of copper from the exposed regions. If desired, the etching action may take place at a temperature higher than room temperature with a corresponding decrease in etching time (determined by the temperature of the etchant).

The improvement in useful life will be best appreciated by some typical examples and comparisons. These examples will reveal that my modified etching solution will not have to be replaced as often in industrial practice as the known type of chromic sulfuric acid etch.

Stated somewhat differently, the effects involved herein may be indicated by the ability to use my improved etchant with great reduction in maximum etching time as compared to that required for baths aged to a stated degree prior to being discarded.

Using a conventional chromic-sulfuric type of copper etchant without agitation, it takes approximately 16 minutes to dissolve two ounce copper (2.8 mils thick) operating at a temperature of approximately 80° C. When the copper content of this conventional bath goes to approximately 23 grams per liter of copper, it would ordinarily take 65 minutes to remove two ounce copper at the same temperature. For most purposes this bath is useless. However, with my improved baths, when aged to a copper content of approximately 23 grams per liter, the etching time is of the order of 17 minutes to dissolve the two ounce copper, which compares favorably to a fresh conventional bath which requires of the order of 16 minutes to dissolve the two ounce copper.

When the copper content of a conventional bath goes to approximately 50 grams per liter, the required etching time is much longer than 65 minutes and such baths should not be used for etching. With my improved bath, the etching time when the copper content goes to 50 grams per liter is of the order of 30 minutes, a time not prohibitive from the commercial standpoint.

A latitude of modification, substitution and change is intended in the foregoing illustrative baths and method and accordingly it is appropriate that the claims herein be construed broadly and in a manner consistent with the spirit and scope of the disclosure. In some instances certain features of the invention will be used without a corresponding use of other features.

What I claim is:

1. An improved etchant for copper and copper alloys consisting of a mixture of chromic and sulfuric acids containing peroxysulfate ions.

2. A method of etching copper and copper alloys consisting of placing said copper or copper alloy in a mixture of chromic and sulfuric acids containing peroxysulfate ions selected from the group consisting of peroxysulfate salts and peroxysulfuric acid.

3. An improved etchant for copper and copper alloys consisting of a mixture of chromic and sulfuric acids containing peroxysulfate ions and silver ions.

4. An improved etchant for copper and copper alloys consisting of a mixture of chromic and sulfuric acids containing peroxysulfate ions selected from the group consisting of peroxysulfate salts and peroxysulfuric acid and silver ions.

5. A method of etching copper and copper alloys consisting of placing said copper or copper alloy in a mixture of chromic and sulfuric acids containing peroxysulfate ions selected from the group consisting of peroxysulfate salts and peroxysulfuric acid and silver ions, said peroxysulfate ions being present in an amount between 14 and 285 grams per liter, said silver ions being present in an amount between .03 and .3 gram per liter.

6. An improved etchant for copper and copper alloys consisting of a mixture of chromic and sulfuric acids containing peroxysulfate ions selected from the group consisting of peroxysulfate salts and peroxysulfuric acid and silver ions, said peroxysulfate ions being present in an amount between 14 and 285 grams per liter.

7. An improved etchant for copper and copper alloys consisting of a mixture of chromic and sulfuric acids containing peroxysulfate ions selected from the group consisting of peroxysulfate salts and peroxysulfuric acid and silver ions, said silver ions being present in an amount between .03 and .3 gram per liter.

8. A method of etching copper and copper alloys consisting of placing said copper or copper alloy in a mixture of chromic and sulfuric acids and containing sodium peroxysulfate present in an amount between 18 and 350 grams per liter.

9. A method of etching copper and copper alloys consisting of placing said copper or copper alloy in a mixture of chromic and sulfuric acids and containing potassium peroxysulfate present in an amount between 20 and 400 grams per liter.

10. A method of etching copper and copper alloys consisting of placing said copper or copper alloy in a mixture of chromic and sulfuric acids and containing peroxysulfuric acid present in an amount between 14 and 290 grams per liter.

References Cited in the file of this patent

UNITED STATES PATENTS

| | | |
|---|---|---|
| 1,106,107 | Parish | Aug. 4, 1914 |
| 1,878,895 | Schutte | Sept. 20, 1932 |
| 2,154,455 | Kepfer | Apr. 18, 1939 |
| 2,172,171 | Meyer et al. | Sept. 5, 1939 |
| 2,650,156 | Shelton-Jones | Aug. 25, 1953 |
| 2,678,876 | Burnside | May 18, 1954 |

FOREIGN PATENTS

| | | |
|---|---|---|
| 1,000,938 | France | Dec. 1, 1949 |

OTHER REFERENCES

Mellor: (vol. 10), "Comprehensive Treatise on Inorganic and Theoretical Chemistry," pp. 448-475, Longmans, Green and Co., New York, New York (1930).